US008433964B2

(12) United States Patent
Akita

(10) Patent No.: US 8,433,964 B2
(45) Date of Patent: Apr. 30, 2013

(54) TEST APPARATUS AND TEST METHOD

(75) Inventor: Tokunori Akita, Saitama (JP)

(73) Assignee: Advantest Corporation, Tokyo (JP)

( * ) Notice: Subject to any disclaimer, the term of this patent is extended or adjusted under 35 U.S.C. 154(b) by 149 days.

(21) Appl. No.: 13/015,484

(22) Filed: Jan. 27, 2011

(65) Prior Publication Data

US 2011/0148492 A1 Jun. 23, 2011

Related U.S. Application Data

(63) Continuation of application No. PCT/JP2009/003885, filed on Aug. 12, 2009.

(30) Foreign Application Priority Data

Aug. 14, 2008 (JP) ................................. 2008-209079

(51) Int. Cl.
*G01R 31/28* (2006.01)
(52) U.S. Cl.
USPC ............... 714/744; 714/724; 714/25; 714/32; 714/707; 714/731; 714/742
(58) Field of Classification Search .................. None
See application file for complete search history.

(56) References Cited

U.S. PATENT DOCUMENTS

| 6,794,678 | B2 | 9/2004 | Hasegawa et al. |
| 7,650,554 | B2 * | 1/2010 | Goldrian et al. ............. 714/733 |
| 7,876,118 | B2 * | 1/2011 | Iwamoto et al. ......... 324/762.01 |
| 2002/0118018 | A1 | 8/2002 | Hasegawa et al. |
| 2005/0210341 | A1 * | 9/2005 | Chiba et al. .................. 714/701 |
| 2007/0266290 | A1 * | 11/2007 | Yamada et al. ............... 714/742 |

FOREIGN PATENT DOCUMENTS

| JP | 2002-108642 A | 4/2002 |
| JP | 2002-230999 A | 8/2002 |
| JP | 2004-40037 A | 2/2004 |
| JP | 2004-53412 A | 2/2004 |
| JP | 2006-294111 A | 10/2006 |
| JP | 2007-10396 A | 1/2007 |
| WO | 2007/077839 A1 | 7/2007 |
| WO | WO 2007077839 | * 7/2007 |

OTHER PUBLICATIONS

"'Flexible Platform' T2000 Applicable to Diversified Testing Needs," online, Advantest Corporation, downloaded from URL: http://www.advantest.co.jp/products/ate/t2000/index.shtml on Jan. 27, 2011.

(Continued)

*Primary Examiner* — John Trimmings

(57) ABSTRACT

Provided is a test apparatus comprising a synchronization module that operates according to a reference clock and outputs a synchronization signal with a prescribed period, and a test module that operates according to a high-frequency clock with a frequency that is n times a frequency of the reference clock. The test module includes a period emulator that emulates the synchronization signal, a phase shifter that shifts a phase of the high-frequency clock by an amount equal to a result of (i) the product of n and the emulated synchronization phase data by (ii) a period of the reference clock, and a test period generating section that generates a test period pulse signal that transitions at an edge timing of the shifted high-frequency clock and test period phase data indicating a phase difference between the test period signal and an edge timing of the test period pulse signal.

18 Claims, 4 Drawing Sheets

OTHER PUBLICATIONS

International Search Report (ISR) issued in PCT/JP2009/003885 (parent application) mailed in Nov. 2009 for Examiner consideration.
Written Opinion (PCT/ISA/237) issued in PCT/JP2009/003885 (parent application) mailed in Nov. 2009.

CN Office Action/ Search Report with English Translation Dated Jan. 14, 2013; Application No. 2009801312192.
TW Office Action/ Search Report with English Translation Dated Jan. 10, 2013; Application No. 098127494.

* cited by examiner

TEST APPARATUS AND TEST METHOD

BACKGROUND

1. Technical Field

The present invention relates to a test apparatus and a test method. In particular, the present invention relates to a test apparatus and a test method for applying different operational clocks to each module in a test apparatus that can realize test functions by modularizing the functions of the test apparatus and connecting these modules to each other.

2. Related Art

Non-Patent Document 1 discloses a test apparatus that provides a flexible platform. In this test apparatus, modules corresponding to a variety of test functions are suitably combined to enable construction or reconstruction of test functions according to the intended use. In this test apparatus, each type of test function is provided as a module, and a plurality of modules work together to cause the overall test apparatus to operate. Accordingly, it is necessary to provide a synchronization function for synchronizing the modules, and this synchronization function can be provided as a synchronization module. Non-Patent Document 1: "'Flexible Platform' T2000 Applicable to Diversified Testing Needs," online, Advantest Corporation (URL:http://www.advantest.co.jp/products/ate/t2000/index.shtml)

The synchronization signal generated by the synchronization module is generated based on the operational clock of the synchronization module, and the other modules each operate according to a unique operational clock. If the operational clocks of the synchronization module and the other modules have the same resolution, i.e. frequency, then there is no problem with synchronizing the modules. However, if there is a high-frequency module that operates according to an operational clock with a higher frequency than the operational clock of the synchronization module, further effort is required to synchronize the modules. Specifically, the phase data in the synchronization signal generated by the synchronization module does not match the phase data in the periodic signal of the high-frequency module, which operates at a higher frequency than the synchronization module, and so the periodic signal of the high-frequency module generated according to this synchronization signal is shifted from its intended phase.

SUMMARY

In order to solve the above problems, according to a first aspect related to the innovations herein, provided is a test apparatus comprising a synchronization module that operates according to a reference clock having a reference frequency and generates a synchronization signal with a prescribed period, the synchronization signal including a synchronization pulse signal that transitions at an edge timing of the reference clock and synchronization phase data indicating a phase difference between the synchronization timing and an edge timing of the synchronization pulse signal; and a test module that operates according to a high-frequency clock with a frequency that is n times a frequency of the reference clock, where n is an integer greater than or equal to one, and tests the device under test based on the test period signal synchronized with the synchronization signal. The test module includes a period emulator that emulates the synchronization signal; a phase shifter that shifts a phase of the high-frequency clock by an amount equal to a result of (i) the product of n and the synchronization phase data emulated by the period emulator divided by (ii) a period of the reference clock; and a test period generating section that generates, as the test period signal, a test period pulse signal that transitions at an edge timing of the high-frequency clock shifted by the phase shifter and test period phase data indicating a phase difference between a period timing of the test period signal and an edge timing of the test period pulse signal.

Also provided is a test apparatus comprising a synchronization module that operates according to a reference clock and outputs a synchronization signal indicating a test synchronization timing based on the reference clock; and a test module that operates according to a high-frequency clock with a frequency that is n times a frequency of the reference clock, where n is an integer greater than or equal to one. The test module includes a phase shifter that selects an edge of the high-frequency clock to be used as a reference for a test signal, based on the synchronization signal; and a test period generating section that generates a test period signal indicating a period of the test signal using the edge selected by the phase shifter as a reference.

The test module may further include a period emulator that emulates the synchronization signal; the synchronization module may generate, as the synchronization signal, a synchronization pulse signal that transitions at an edge timing of the reference clock and synchronization phase data indicating a phase difference between the synchronization timing and an edge timing of the synchronization pulse signal; the phase shifter may select the edge by shifting a phase of the high-frequency clock by an amount equal to a result of (i) the product of n and the synchronization phase data emulated by the period emulator divided by (ii) a period of the reference clock; and the test period generating section may generate, as the test period signal, a test period pulse signal that transitions at an edge timing of the high-frequency clock shifted by the phase shifter and test period phase data indicating a phase difference between a period timing of the test period signal and an edge timing of the test period pulse signal.

The test module may operate based on a high-frequency clock whose frequency is double that of the reference clock, and the phase shifter may shift a phase of the high-frequency clock by one phase when the synchronization phase data is two or more. The test apparatus may further comprise a reference frequency module that operates based on a clock signal whose frequency is the same as the frequency of the reference clock. The synchronization module, the test module, and the reference frequency module may be connected to each other by a bus having a certain standard. In this case, the test module and the reference frequency module may operate in synchronization according to a single synchronization signal from the synchronization module.

According to a second aspect related to the innovations herein, provided is a test method performed by a test apparatus including a synchronization module that operates according to a reference clock having a reference frequency and generates a synchronization signal with a prescribed period, the synchronization signal including a synchronization pulse signal that transitions at an edge timing of the reference clock and synchronization phase data indicating a phase difference between the synchronization timing and an edge timing of the synchronization pulse signal, and a test module that operates according to a high-frequency clock with a frequency that is n times a frequency of the reference clock, where n is an integer greater than or equal to one, and tests the device under test based on the test period signal synchronized with the synchronization signal. The test method comprises emulating, using the test module, the synchronization signal; shifting a phase of the high-frequency clock by an amount equal to a result of (i) the product of n and the emulated synchronization phase data divided by (ii) a period of the reference clock;

and generating, as the test period signal, a test period pulse signal that transitions at an edge timing of the shifted high-frequency clock and test period phase data indicating a phase difference between a period timing of the test period signal and an edge timing of the test period pulse signal.

Also provide is a test method performed by a test apparatus including a synchronization module that operates according to a reference clock and outputs a synchronization signal indicating a test synchronization timing based on the reference clock and a test module that operates according to a high-frequency clock with a frequency that is n times a frequency of the reference clock, where n is an integer greater than or equal to one. The test method comprises selecting, using the test module, an edge of the high-frequency clock to be used as a reference for a test signal, based on the synchronization signal; and generating, using the test module, a test period signal indicating a period of the test signal using the selected edge as a reference.

The test method may further comprise emulating, using the test module, the synchronization signal, the synchronization module may generate, as the synchronization signal, a synchronization pulse signal that transitions at an edge timing of the reference clock and a synchronization phase data indicating a phase difference between the synchronization timing and an edge timing of the synchronization pulse signal; the selecting may include selecting the edge by shifting a phase of the high-frequency clock by an amount equal to a result of (i) the product of n and the emulated synchronization phase data divided by (ii) a period of the reference clock; and generating the test period signal may include generating, as the test period signal, a test period pulse signal that transitions at an edge timing of the shifted high-frequency clock and test period phase data indicating a phase difference between a period timing of the test period signal and an edge timing of the test period pulse signal.

The test module may operate based on a high-frequency clock whose frequency is double that of the reference clock, and the selecting may include shifting a phase of the high-frequency clock by one phase when the synchronization phase data is two or more. The test method may further comprise causing a reference frequency module to operate based on a clock signal whose frequency is the same as the frequency of the reference clock. The synchronization module, the test module, and the reference frequency module may be connected to each other by a bus having a certain standard, and the test module and the reference frequency module may be synchronized via the bus by the synchronization signal output by the synchronization module. The test module and the reference frequency module may operate in synchronization according to a single synchronization signal from the synchronization module.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
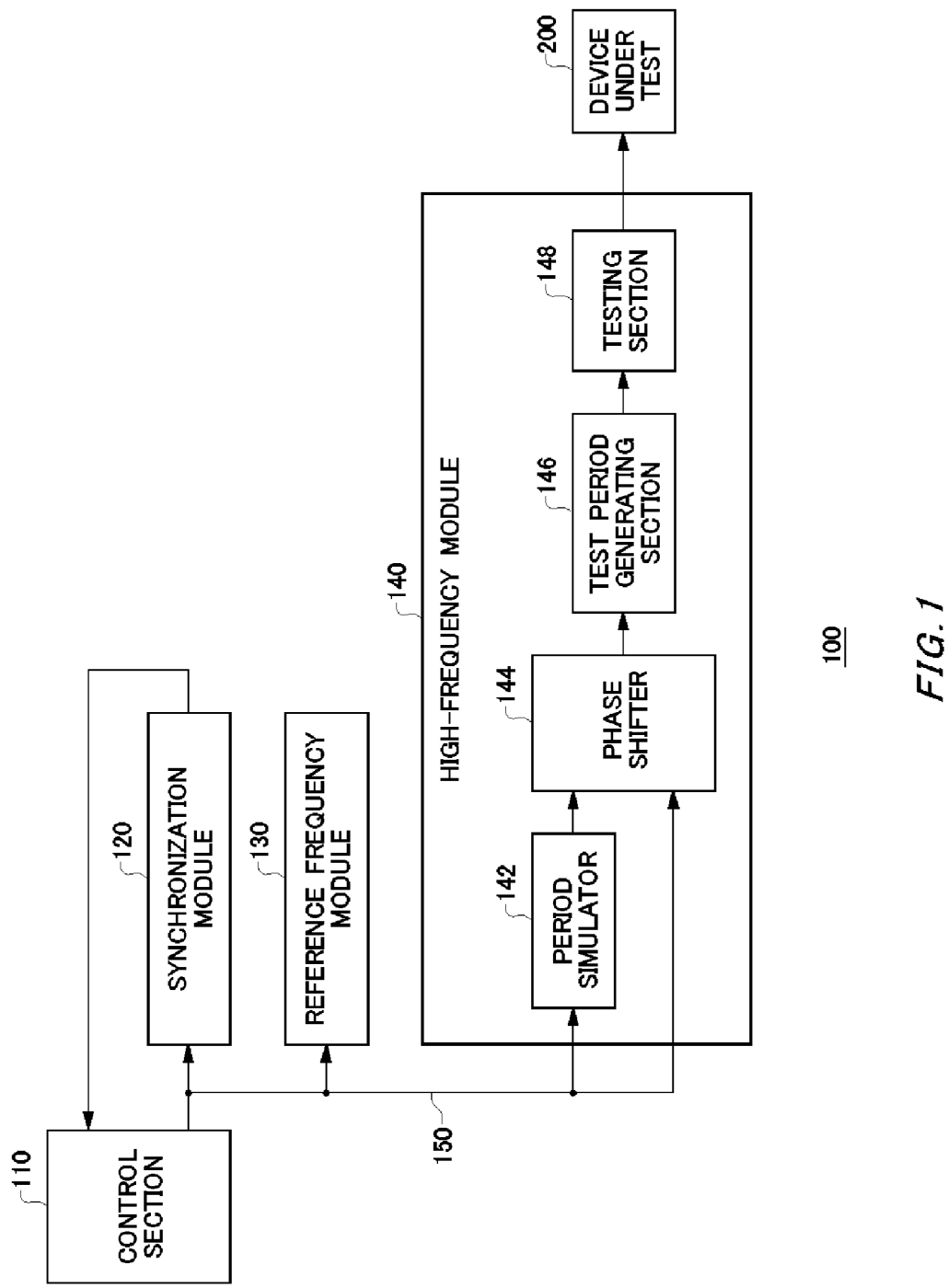
FIG. 1 shows an exemplary block configuration of a test apparatus 100 according to an embodiment of the present invention, together with a device under test 200.

FIG. 1 shows an exemplary block configuration of a test apparatus 100 according to an embodiment of the present invention, together with a device under test 200. The test apparatus 100 includes a control section 110, a synchronization module 120, a reference frequency module 130, a high-frequency module 140, and a bus 150. The high-frequency module 140 includes a period emulator 142, a phase shifter 144, a test period generating section 146, and a testing section 148.

The control section 110 performs overall control of the test apparatus 100. For example, the control section 110 may receive a synchronization signal from the synchronization module and transmit control data to each module connected to the bus 150.

The synchronization module 120 generates a synchronization signal that serves as a reference for synchronizing components of the test apparatus 100, including the control section 110, the reference frequency module 130, and the high-frequency module 140. The synchronization module 120 operates according to a reference clock having a reference frequency to generate a synchronization signal with a prescribed period. The synchronization module 120 generates, as the synchronization signal, a synchronization pulse signal that transitions at an edge timing of the reference clock and synchronization phase data that indicates a phase difference between the timing of a prescribed period and the edge timing of the synchronization pulse signal. The synchronization signal may be supplied to the control section 110, the reference frequency module 130, the high-frequency module 140, and the like via the bus 150 or individual control lines.

The reference frequency module 130 operates based on a clock signal having the same frequency as the reference frequency. In other words, the reference frequency module 130 and the synchronization module 120 operate according to operational clocks having the same frequency, and therefore have the same time resolution. Accordingly, the synchronization signal generated based on the reference clock of the reference frequency can be applied as-is to the reference frequency module 130, such that the reference frequency module 130 operates in synchronization based on the synchronization signal.

On the other hand, the high-frequency module 140 operates according to a high-frequency clock with a frequency that is n times the reference frequency, where n is an integer greater than or equal to 1. Accordingly, the high-frequency module 140 and the synchronization module 120 have different time resolutions, and therefore the synchronization signal from the synchronization module 120 cannot be applied as-is to the high-frequency module 140. In the present embodiment, the high-frequency module 140 is provided with a period emulator 142 and a phase shifter 144 to synchronize the high-frequency module 140 with the synchronization signal and test the device under test 200 based on a test period signal synchronized with the synchronization signal. The high-frequency module 140 is an example of a test module.

The period emulator 142 emulates the synchronization signal. The period emulator 142 can include a circuit identical to the synchronization signal generating section of the synchronization module 120, and can generate a dummy synchronization pulse signal and dummy synchronization phase data similar to the synchronization pulse signal and synchronization phase data of the synchronization module 120. The emulation signal generated by the period emulator 142, which is the dummy synchronization pulse signal and dummy synchronization phase data, can be synchronized by referencing the synchronization signal generated by the synchronization module 120.

The phase shifter 144 shifts the phase of the high-frequency clock by an amount obtained by dividing (i) the product of n and the dummy synchronization phase data, which may be the synchronization phase data emulated by the period emulator 142, by (ii) the period of the reference clock. As a result, the mismatch of the phase data based on the difference in operational clock frequency between the synchronization module 120 and the high-frequency module 140 can be eliminated, and the modules having different operational frequencies, i.e. time resolutions, can be synchronized. If the high-frequency module 140 operates according to a high-frequency clock that has double the reference frequency, the phase shifter 144 can shift the phase of the high-frequency clock by one phase when the synchronization phase data is two or greater.

The test period generating section 146 generates a test period signal based on the high-frequency clock. The test period generating section 146 generates, as the test period signal, a test period pulse signal that transitions at an edge timing of the high-frequency clock shifted by the phase shifter 144 and test period phase data indicating a phase difference between the period timing of the test period signal and the edge timing of the test period pulse signal.

The testing section 148 tests the device under test 200 based on the test period signal generated by the test period generating section 146. For example, the testing section 148 can generate a test pattern to be supplied to the device under test 200 and generate an expected value pattern corresponding to the test pattern. The testing section 148 may receive an output pattern from the device under test 200 in response to the test pattern, and compare this output pattern to the expected value pattern to judge pass/fail of the device under test 200.

The bus 150 connects the synchronization module 120, the high-frequency module 140, and the reference frequency module 130 to the control section 110. For example, the bus 150 may conform to a certain standard, such as an open star standard, and connect the synchronization module 120, the high-frequency module 140, and the reference frequency module 130 to each other. The high-frequency module 140 and the reference frequency module 130 may operate in synchronization with a single synchronization signal from the synchronization module 120. The bus 150 may be connected only to the high-frequency module 140, or may be connected to the high-frequency module 140 and the reference frequency module 130 as well. The control section 110 may include the same function as the synchronization module 120, and in this case the synchronization module 120 is not connected to the bus 150.

Figure 2:
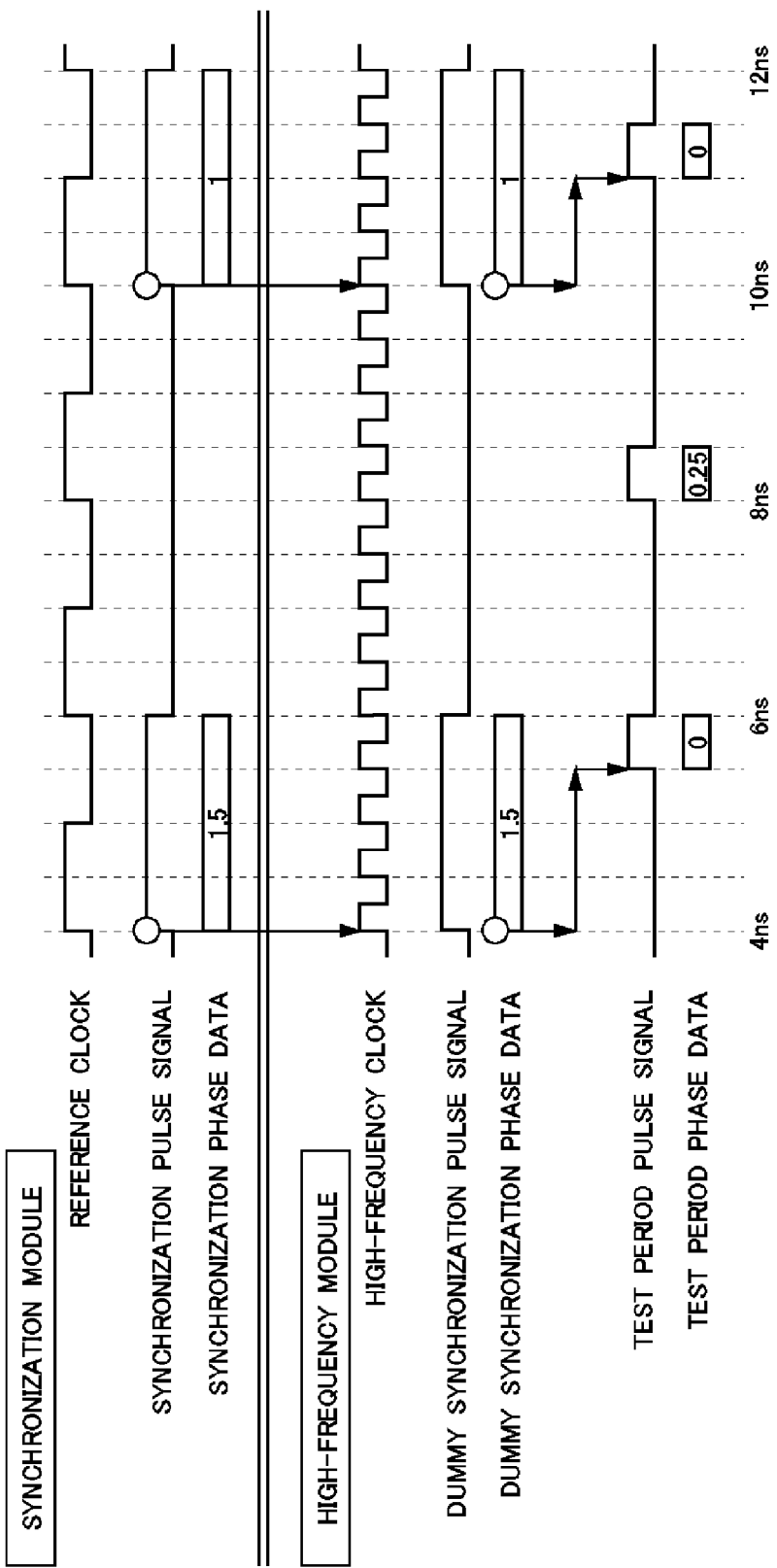
FIG. 2 shows exemplary operational timings of the synchronization module 120 and the high-frequency module 140.

FIG. 2 shows exemplary operational timings of the synchronization module 120 and the high-frequency module 140. In FIG. 2, the reference clock and synchronization signal, i.e. the synchronization pulse signal and the synchronization phase data, of the synchronization module 120, are shown above the double line. Furthermore, the high-frequency clock and dummy synchronization signal, i.e. the dummy synchronization pulse signal and the dummy synchronization phase data, and the test period signal, i.e. the test period pulse signal and the test period phase data, of the high-frequency module 140 are shown below the double line. In FIG. 2, the horizontal axis represents time, and the following describes operations in the time range shown by the horizontal axis. It is obvious that the same operations can be repeated outside the time range shown in FIG. 2.

The reference clock, which is the operational clock of the synchronization module 120, has a period of 2 ns, and therefore the operational frequency of the synchronization module 120 is 500 MHz. The synchronization signal described here is generated with a period of 5.5 ns.

The synchronization signal is generated as a synchronization pulse signal and synchronization phase data. The synchronization pulse signal rises at timings of 4 ns and 10 ns, which are the rising timings of the reference clock and close to integer multiples of 5.5 ns, which is the period of the synchronization signal. While the synchronization pulse signal is at the high level, the synchronization phase data is output. The synchronization phase data indicates the phase difference between the timing of the period of the synchronization signal and the rising timing of the synchronization pulse signal. For the rising timing of the synchronization pulse signal at 4 ns, since the period of the synchronization signal is 5.5 ns, the synchronization phase data is 5.5−4=1.5. For the rising timing of the synchronization pulse signal at 10 ns, since the period of the synchronization signal is 11 ns (5.5×2), the synchronization phase data is 11−10=1.

The high-frequency clock, which is the operational clock of the high-frequency module 140, has a period of 0.5 ns, and therefore the operational frequency of the high-frequency module 140 is 2 GHz. The operational frequencies of the synchronization module 120 and the high-frequency module 140 have a ratio of 1:4.

In the high-frequency module 140, the period emulator 142 generates the dummy synchronization pulse signal and the dummy synchronization phase data. The period emulator 142 receives from the synchronization module 120 the synchronization pulse signal and the synchronization phase data, and causes the dummy synchronization pulse signal to rise at the rising timing of the high-frequency clock. It should be noted that the rising timings of the reference clock of the synchronization module 120 each match a rising timing of the high-frequency clock of the high-frequency module 140.

The period emulator 142 receives the synchronization phase data from the synchronization module 120 when the dummy synchronization pulse signal rises, and holds the synchronization phase data as dummy synchronization phase data. When the synchronization pulse signal is received from the synchronization module 120 at a timing that is not synchronized with the timing of the rising edge of the high-frequency clock, this synchronization pulse signal can be ignored. When the synchronization pulse signal from the synchronization module 120 is ignored, the period emulator 142 can estimate a synchronization signal that will be generated by the synchronization module 120 in the future, and generate the dummy synchronization pulse signal and the dummy synchronization phase data using a calculation, for example.

The phase shifter 144 shifts the high-frequency clock according to the value of the dummy synchronization phase data. In other words, when the operational frequency ratio of the high-frequency module 140 to the synchronization module 120 is n, the high-frequency clock is shifted by a number of stages expressed by (i) the product of n and the value of the dummy synchronization phase data divided by (ii) the period of the reference clock. In the example of FIG. 2, the dummy synchronization phase data has a value of 1.5 for the synchronization signal at 4 ns, and therefore the high-frequency clock is shifted by 1.5×4/2=3 stages. The dummy synchronization phase data has a value of 1 for the synchronization signal at 10 ns, and therefore the high-frequency clock is shifted by 1×4/2=2 stages.

The test period generating section 146 generates the test period signal, i.e. the test period pulse signal and the test period phase data, based on the shifted high-frequency clock. When the test period signal is generated with a period of 2.75 ns, as shown in FIG. 2, the test period pulse signal is generated at 5.5 ns, 8 ns, and 11 ns, and the test period phase data at these timings is 0, 0.25, and 0, respectively.

Figure 3:
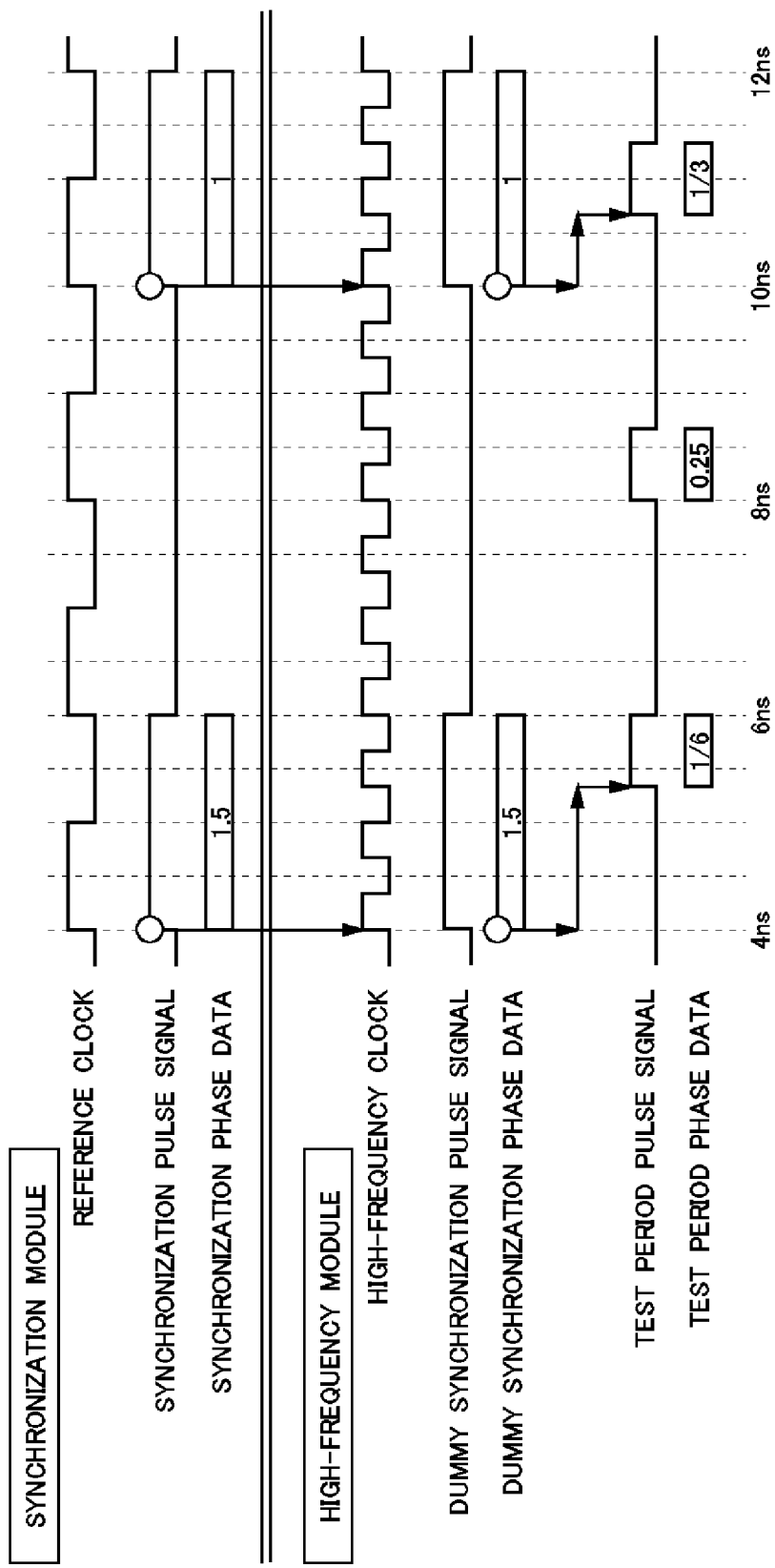
FIG. 3 shows other exemplary operational timings of the synchronization module 120 and the high-frequency module 140.

FIG. 3 shows other exemplary operational timings of the synchronization module 120 and the high-frequency module 140. The layout of the reference clock and the like in FIG. 3 is practically the same as in FIG. 2, and the following describes only differing points.

The operation clock of the high-frequency module 140 in FIG. 3, i.e. the high-frequency clock, has a period of ⅔ ns, and therefore the operational frequency of the high-frequency module 140 is 1.5 GHz. The operational frequency ratio n of the high-frequency module 140 to the synchronization module 120 is 3. Accordingly, the number of stages that the phase shifter 144 shifts the high-frequency clock is calculated as shown below.

In the example of FIG. 3, the dummy synchronization phase data is 1.5 for the synchronization signal at 4 ns, and therefore the high-frequency clock is shifted by 1.5×3/2=2 stages. It should be noted that decimals resulting from this calculation are dropped. The dummy synchronization phase data is 1 for the synchronization signal at 10 ns, and therefore the high-frequency clock is shifted by 1×3/2=1 stage.

The test period generating section 146 generates the test period signal, i.e. the test period pulse signal and the test period phase data, based on the shifted high-frequency clock. When the test period signal is generated with a period of 2.75 ns, as shown in FIG. 3, the test period pulse signal is generated at 5.33 ns, 8 ns, and 10.66 ns, and the test period phase data at these timing is respectively ⅙, 0.25, and ⅓.

Figure 4:
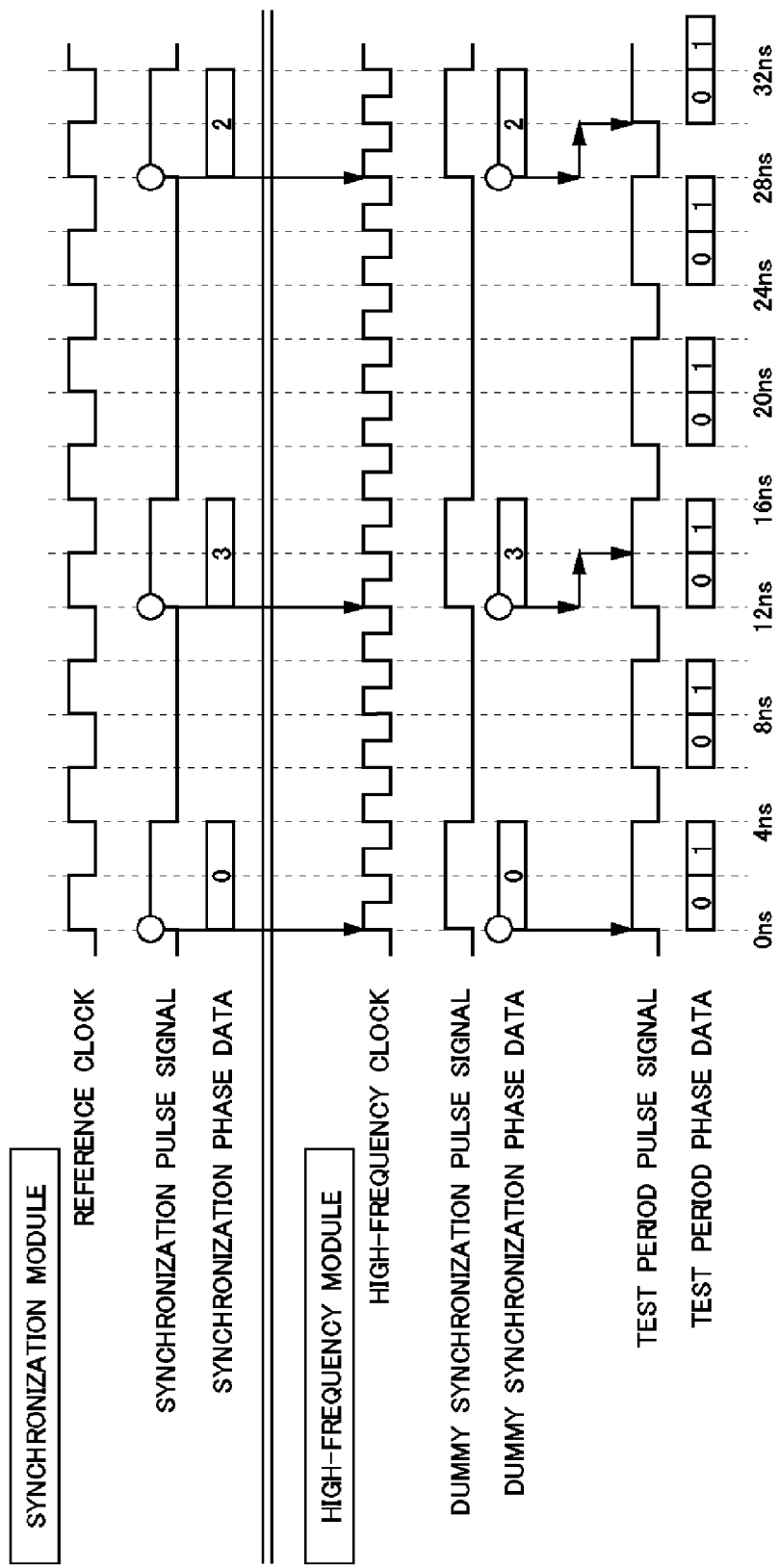
FIG. 4 shows other exemplary operational timings of the synchronization module 120 and the high-frequency module 140.

FIG. 4 shows other exemplary operational timings of the synchronization module 120 and the high-frequency module 140. The layout of the reference clock and the like in FIG. 4 is practically the same as in FIGS. 2 and 3, and the following describes only differing points.

The reference clock, which is the operational clock of the synchronization module 120, has a period of 4 ns, and therefore the operational frequency of the synchronization module 120 is 250 MHz. In this example, the synchronization signal is generates with a period of 15 ns. The synchronization pulse signal rises at 0 ns, 12 ns, and 28 ns, which are the timings of the rising of the reference clock near multiples of 15 ns, which is the period of the synchronization signal. The synchronization phase data at these timings is respectively 0, 3, and 2.

The high-frequency clock, which is the operational clock of the high-frequency module 140, has a period of 2 ns, and therefore the operational frequency of the high-frequency module 140 is 500 MHz. The operational frequency ratio of the high-frequency module 140 relative to the synchronization module 120 is 2. In this case, the calculation concerning the number of stages to be shifted by the phase shifter 144 is simple. Specifically, the phase shifter 144 shifts the phase of the high-frequency clock by 1 when the dummy synchronization phase data is two or more.

In the example of FIG. 4, the dummy synchronization phase data is 0 for the synchronization signal at 0 ns, and therefore the phase of the high-frequency clock is not shifted. The dummy synchronization phase data is 3 for the synchronization signal at 12 ns, and therefore the phase of the high-frequency clock is shifted by 1 stage. The dummy synchronization phase data is 2 for the synchronization signal at 28 ns, and therefore the phase of the high-frequency clock is shifted by one stage.

The test period generating section 146 generates the test period signal, i.e. the test period pulse signal and the test period phase data, based on the shifted high-frequency clock. When the test period signal is generated with a period of 3 ns, the test period pulse signal and the test period phase data can be generated as shown in FIG. 4.

In the above embodiment, by providing the period emulator 142 and the phase shifter 144 in the high-frequency module 140, whose operational frequency is higher than that of the synchronization module 120, the high-frequency module 140 can also be synchronized using the synchronization signal generated by the synchronization module 120. Furthermore, the reference frequency module 130 having the same operational frequency as the synchronization module 120 can be synchronized simply by using the synchronization signal. As a result, the high-frequency module 140 and the reference frequency module 130 can be synchronized using a single synchronization signal generated by the synchronization module 120, regardless of the difference in operational frequency therebetween.

The synchronization module 120, the reference frequency module 130, and the high-frequency module 140 may each generate the reference clock and the high-frequency clock using individual oscillation circuits, or the reference clock and the high-frequency clock to be used by the synchronization module 120, the reference frequency module 130, and the high-frequency module 140 may be generated based on a single source clock.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

What is claimed is:

1. A test apparatus comprising:
a synchronization module that operates according to a reference clock and outputs a synchronization signal indicating a test synchronization timing based on the reference clock; and
a test module that operates according to a high-frequency clock with a frequency that is n times a frequency of the reference clock, where n is an integer greater than or equal to one, wherein the test module includes:
a phase shifter that selects an edge of the high-frequency clock to be used as a reference for a test signal, based on the synchronization signal; and
a test period generating section that generates a test period signal indicating a period of the test signal using the edge selected by the phase shifter as a reference.

2. The test apparatus according to claim 1, wherein
the test module further includes a period emulator that emulates the synchronization signal,
the synchronization module generates, as the synchronization signal, a synchronization pulse signal that transitions at an edge timing of the reference clock and synchronization phase data indicating a phase difference between the synchronization timing and an edge timing of the synchronization pulse signal, the phase shifter selects the edge by shifting a phase of the high-frequency clock by an amount equal to a result of (i) the product of n and the synchronization phase data emulated by the period emulator divided by (ii) a period of the reference clock, and the test period generating section generates, as the test period signal, a test period pulse signal that transitions at an edge timing of the high-frequency clock shifted by the phase shifter and test period phase data indicating a phase difference between a period timing of the test period signal and an edge timing of the test period pulse signal.

3. The test apparatus according to claim 2, wherein
the test module operates based on a high-frequency clock whose frequency is double that of the reference clock, and the phase shifter shifts a phase of the high-frequency clock by one stage when the synchronization phase data is two or more.

4. The test apparatus according to claim 3, further comprising a reference frequency module that operates based on a clock signal whose frequency is the same as the frequency of the reference clock.

5. The test apparatus according to claim 4, wherein
the synchronization module, the test module, and the reference frequency module are connected to each other by a bus having a certain standard.

6. The test apparatus according to claim 4, wherein
the test module and the reference frequency module operate in synchronization according to a single synchronization signal from the synchronization module.

7. The test apparatus according to claim 1, further comprising a reference frequency module that operates based on a clock signal whose frequency is the same as the frequency of the reference clock.

8. The test apparatus according to claim 7, wherein
the synchronization module, the test module, and the reference frequency module are connected to each other by a bus having a certain standard.

9. The test apparatus according to claim 7, wherein
the test module and the reference frequency module operate in synchronization according to a single synchronization signal from the synchronization module.

10. A test method performed by a test apparatus including a synchronization module that operates according to a reference clock and outputs a synchronization signal indicating a test synchronization timing based on the reference clock and a test module that operates according to a high-frequency clock with a frequency that is n times a frequency of the reference clock, where n is an integer greater than or equal to one, the test method comprising:

selecting, using the test module, an edge of the high-frequency clock to be used as a reference for a test signal, based on the synchronization signal; and generating, using the test module, a test period signal indicating a period of the test signal using the selected edge as a reference.

11. The test method according to claim 10, further comprising emulating, using the test module, the synchronization signal, wherein the synchronization module generates, as the synchronization signal, a synchronization pulse signal that transitions at an edge timing of the reference clock and a synchronization phase data indicating a phase difference between the synchronization timing and an edge timing of the synchronization pulse signal, the selecting includes selecting the edge by shifting a phase of the high-frequency clock by an amount equal to a result of (i) the product of n and the emulated synchronization phase data divided by (ii) a period of the reference clock, and generating the test period signal includes generating, as the test period signal, a test period pulse signal that transitions at an edge timing of the shifted high-frequency clock and test period phase data indicating a phase difference between a period timing of the test period signal and an edge timing of the test period pulse signal.

12. The test method according to claim 11, wherein
the test module operates based on a high-frequency clock whose frequency is double that of the reference clock, and the selecting includes shifting a phase of the high-frequency clock by one stage when the synchronization phase data is two or more.

13. The test method according to claim 12, further comprising causing a reference frequency module to operate based on a clock signal whose frequency is the same as the frequency of the reference clock.

14. The test method according to claim 13, wherein
the synchronization module, the test module, and the reference frequency module are connected to each other by a bus having a certain standard, and the test module and the reference frequency module are synchronized via the bus by the synchronization signal output by the synchronization module.

15. The test method according to claim 13, wherein
the test module and the reference frequency module operate in synchronization according to a single synchronization signal from the synchronization module.

16. The test method according to claim 10, further comprising causing a reference frequency module to operate based on a clock signal whose frequency is the same as the frequency of the reference clock.

17. The test method according to claim 16, wherein
the synchronization module, the test module, and the reference frequency module are connected to each other by a bus having a certain standard, and the test module and the reference frequency module are synchronized via the bus by the synchronization signal output by the synchronization module.

18. The test method according to claim 16, wherein
the test module and the reference frequency module operate in synchronization according to a single synchronization signal from the synchronization module.

* * * * *